United States Patent
Wang et al.

(10) Patent No.: US 9,288,904 B2
(45) Date of Patent: Mar. 15, 2016

(54) HALOGEN-FREE RESIN COMPOSITION, COPPER CLAD LAMINATE USING THE SAME, AND PRINTED CIRCUIT BOARD USING THE SAME

(71) Applicant: ELITE ELECTRONIC MATERIAL (KUNSHAN) CO., LTD., Jiangsu Province (CN)

(72) Inventors: Rong-Tao Wang, Jiangsu Province (CN); Li-Ming Chou, Tao-Yuan Hsien (TW); Li-Chih Yu, Tao-Yuan Hsien (TW); Yu-Te Lin, Tao-Yuan Hsien (TW)

(73) Assignee: ELITE ELECTRONIC MATERIAL (KUNSHAN) CO., LTD, Jiangsu Province (CN)

( * ) Notice: Subject to any disclaimer, the term of this patent is extended or adjusted under 35 U.S.C. 154(b) by 0 days.

(21) Appl. No.: 13/739,666

(22) Filed: Jan. 11, 2013

(65) Prior Publication Data

US 2014/0023839 A1    Jan. 23, 2014

(30) Foreign Application Priority Data

Jul. 17, 2012  (CN) .......................... 2012 1 0247249

(51) Int. Cl.
| | |
|---|---|
| *B32B 27/38* | (2006.01) |
| *H05K 1/03* | (2006.01) |
| *C08L 63/00* | (2006.01) |
| *C08G 59/50* | (2006.01) |
| *C08J 5/24* | (2006.01) |

(52) U.S. Cl.
CPC .......... *H05K 1/0353* (2013.01); *C08G 59/5033* (2013.01); *C08J 5/24* (2013.01); *C08L 63/00* (2013.01); *C08J 2363/00* (2013.01); *H05K 2201/012* (2013.01); *Y10T 428/24917* (2015.01); *Y10T 428/31529* (2015.04)

(58) Field of Classification Search
None
See application file for complete search history.

(56) References Cited

U.S. PATENT DOCUMENTS

| | | | |
|---|---|---|---|
| 7,255,925 B2 | 8/2007 | Chung et al. | |
| 7,390,857 B2 | 6/2008 | Cella et al. | |
| 2006/0125119 A1* | 6/2006 | Xiao et al. | 257/793 |
| 2009/0072086 A1* | 3/2009 | Smith et al. | 244/119 |
| 2009/0156715 A1* | 6/2009 | Dueber et al. | 524/100 |
| 2010/0166998 A1* | 7/2010 | Bannister et al. | 428/61 |
| 2012/0318571 A1* | 12/2012 | Tietze et al. | 174/258 |

FOREIGN PATENT DOCUMENTS

| | | | |
|---|---|---|---|
| CN | 101735456 | | 6/2010 |
| CN | 102199351 A | | 9/2011 |
| WO | WO2011109463 | * | 9/2011 |

OTHER PUBLICATIONS

Chemical Boo: Dially bisphenol A Baisc information. Retrieved on Apr. 13, 2014. http://www.chemicalbook.com/ProductChemicalPropertiesCB9460153_EN.htm.*
English key contents of CN 102199351A.
C.P. Reghunadhan Nair, "Advances in Addition-Cure Phenolic Resins," Prog. Polym. Sci. 29 (2004) 401-498.

* cited by examiner

*Primary Examiner* — Coris Fung
(74) *Attorney, Agent, or Firm* — WPAT, P.C.; Anthony King

(57) ABSTRACT

A halogen-free resin composition includes (A) 100 parts by weight of epoxy resin; (B) 10 to 100 parts by weight of benzoxazine resin; (C) 5 to 50 parts by weight of diallyl-bisphenol A resin; and (D) 0.05 to 20 parts by weight of an amine curing agent. The halogen-free resin composition includes specific ingredients and proportions thereof to attain low dielectric constant (Dk), low dissipation factor (Df), high heat resistance, and high flame retardation. The halogen-free resin composition is suitable for producing a prepreg or a resin film and thus applicable to copper clad laminates and printed circuit boards.

9 Claims, No Drawings

HALOGEN-FREE RESIN COMPOSITION, COPPER CLAD LAMINATE USING THE SAME, AND PRINTED CIRCUIT BOARD USING THE SAME

CROSS-REFERENCE TO RELATED APPLICATION

This non-provisional application claims priority under 35 U.S.C. §119(a) on Patent Application No(s). 201210247249.3 filed in China on Jul. 17, 2012, the entire contents of which are hereby incorporated by reference.

FIELD OF THE INVENTION

The present invention relates to halogen-free resin compositions, and more particularly, to a halogen-free resin composition applicable to copper clad laminates, and printed circuit boards.

BACKGROUND OF THE INVENTION

To get in line with the global trend of environmental protection, and eco-friendly regulations, electronic product manufacturers nowadays are developing, and manufacturing halogen-free electronic products. Advanced countries, and electronic manufacturing giants set forth schedules of launching mass production of halogen-free electronic products. As a result of the promulgation of the Restriction of Hazardous Substances (RoHS) by the European Union, hazardous substances, such as lead, cadmium, mercury, hexavalent chromium, poly-brominated biphenyl (PBB), and poly-brominated diphenyl ether (PBDE), are strictly prohibited from being used in manufacturing electronic products or their parts, and components. A printed circuit board (PCB) is an indispensable, and fundamental basis of the semiconductor industry, and electronic industry; hence, printed circuit boards bore the brunt of international halogen-free regulations when international organizations set forth strict requirements of the halogen content of printed circuit boards. For example, the International Electrotechnical Commission (IEC) 61249-2-21 requires that bromide content, and chloride content shall be less than 900 ppm, and the total halogen content shall be less than 1500 ppm. The Japan Electronics Packaging, and Circuits Association (JPCA) requires that both bromide content, and chloride content shall be less than 900 ppm. To enforce its green policies, Greenpeace calls on manufacturers worldwide to get rid of polyvinyl chloride (PVC), and brominated flame retardants (BFRs) from their electronic products in order to conform with the lead-free, and halogen-free requirements of green electronics. Hence, the industrial sector nowadays is interested in rendering related materials halogen-free, and sees this technique as one of its key research topics.

Electronic products nowadays have the trend toward compactness, and high-frequency transmission; hence, circuit boards nowadays typically feature a high-density layout, and increasingly strict material requirements. To mount high-frequency electronic components on a circuit board, it is necessary that the substrate of the circuit board is made of a material of a low dielectric constant (Dk), and dielectric dissipation factor (Df) in order to maintain the transmission speed, and the integrity of a signal transmitted. To allow the electronic components to operate well at a high temperature, and a high-humidity environment, it is necessary for the circuit board to be heat resistant, fire resistant, and of low hygroscopicity. Epoxy resin is adhesive, heat resistant, and malleable, and thus is widely applicable to encapsulants, and copper clad laminates (CCL) of electronic components, and machinery. From the perspective of fire prevention, and safety, any applicable material is required to be capable of flame retardation. In general, epoxy resin is incapable of flame retardation, and thus epoxy resin has to acquire flame retardation capability by including a flame retardant therein. For example, a halogen, especially bromine, is included in epoxy resin to bring about flame retardation capability of epoxy resin, and enhance the reactivity of the epoxy group. Furthermore, when exposed to a high temperature for a long period of time, a halogen compound is likely to decompose, and thereby erode a fine circuit. Furthermore, combustion of discarded used electronic parts, and components produces hazardous compounds, such as halogen compounds, which are environmentally unfriendly. To find an alternative to the aforesaid halogen compound-based flame retardant, researchers attempt to use a phosphorous compound as a flame retardant, for example, adding phosphate ester (U.S. Pat. No. 6,440,567) or red phosphorus (EP 0763566) to an epoxy resin composition. However, phosphate ester undergoes hydrolysis readily to produce an acid, thereby compromising its tolerance to migration. Although red phosphorus is good at flame retardation, it falls into the category of hazardous compounds under the firefighting law, because it produces a trace of a flammable, toxic gas known as phosphine in a warm humid environment.

A conventional circuit board manufacturing method, such as a conventional method of manufacturing a copper-clad substrate (also known as copper clad laminate, CCL), involves heating, and combining a reinforcement material (such as a glass fabric), and a thermosetting resin composition made of an epoxy resin, and a curing agent to form a prepreg, and then laminating the prepreg, and the upper, and lower copper foils together at a high temperature, and a high pressure. The prior art usually teaches using a thermosetting resin composed of an epoxy resin, and a hydroxyl (—OH)-containing phenol novolac resin curing agent. Due to the combination of the phenol novolac resin and the epoxy resin, epoxide ring-opening reactions end up with another hydroxyl which not only increases the dielectric constant (Dk), and the dielectric dissipation factor inherently, but also reacts with water readily, and thereby renders the thermosetting resin more hygroscopic.

U.S. Pat. No. 7,255,925 discloses a thermosetting resin composition composed of cyanate ester resin, dicyclopentadiene (DCPD) epoxy resin, silica, and a thermoplastic resin. The thermosetting resin composition is characterized by a low dielectric constant (Dk), and a low dielectric dissipation factor. However, a method for manufacturing the thermosetting resin composition of U.S. Pat. No. 7,255,925 requires the use of a halogen-containing (such as bromine-containing) flame retardant, such as tetrabromocyclohexane, hexabromocyclodecane, or 2,4,6-tri(tribromophenoxy)-1,3,5-triazine. However, the bromine-containing flame retardant causes environmental pollution readily during the thermosetting resin composition manufacturing process, the using processing of thermosetting resin composition, and even after the thermosetting resin composition has been discarded or recycled. To ensure a low dielectric dissipation factor, low hygroscopicity, high cross-linking density, high glass transition temperature, high connectivity, appropriate thermal expansion, heat resistance, and fire resistance of copper clad laminates, an important factor lies in the selection of an epoxy resin, a curing agent, and a reinforcement material.

The major considerations given to electrical properties include the dielectric constant (Dk), and the dielectric dissipation factor (Df). In general, the signal transmission speed of a copper-clad substrate is inversely proportional to the square root of the dielectric constant (Dk) of the material from which the copper-clad substrate is made, and thus the minimization of the dielectric constant (Dk) of the substrate material is usually advantageously important. The lower the dielectric dissipation factor is, the lesser the signal transmission attenuation is; hence, a material of a low dielectric dissipation factor provides satisfactory transmission quality.

Accordingly, it is important for printed circuit board material suppliers to develop materials of a low dielectric constant (Dk) and a low dielectric dissipation factor (Df), and apply the materials to high-frequency printed circuit board manufacturing.

SUMMARY OF THE INVENTION

In view of the aforesaid drawbacks of the prior art, the inventor of the present invention conceived room for improvement in the prior art, and thus conducted extensive researches, and experiments according to the inventor's years of experience in the related industry, and finally developed a halogen-free resin composition as disclosed in the present invention to achieve a low dielectric constant (Dk), a low dissipation factor (Df), high heat resistance, and high flame retardation.

It is an objective of the present invention to provide a halogen-free resin composition comprising specific ingredients, and characterized by specific proportions thereof so as to achieve a low dielectric constant (Dk), a low dielectric dissipation factor, high heat resistance, and high flame retardation. The halogen-free resin composition is suitable for producing a prepreg or a resin film, and thus applicable to copper clad laminates, and printed circuit boards.

In order to achieve the above and other objectives, the present invention provides a halogen-free resin composition comprising: (A) 100 parts by weight of epoxy resin; (B) 10 to 100 parts by weight of benzoxazine resin; (C) 5 to 50 parts by weight of diallylbisphenol A resin; and (D) 0.05 to 20 parts by weight of an amine curing agent.

As regards its purpose, the halogen-free resin composition is applicable to the manufacturing of a prepreg, a resin film, a copper clad laminate, and a printed circuit board. Therefore, the halogen-free resin composition of the present invention is characterized by specific ingredients which are of specific proportions, so as to achieve a low dielectric constant (Dk), a low dissipation factor (Df), high heat resistance, and high flame retardation. Therefore, the halogen-free resin composition of the present invention is effective in manufacturing a prepreg or a resin film and thereby applicable to copper clad laminates and printed circuit boards.

As regards the halogen-free resin composition of the present invention, the ingredient (A) epoxy resin is one, or a combination, of: bisphenol A epoxy resin, bisphenol F epoxy resin, bisphenol S epoxy resin, bisphenol AD epoxy resin, phenol novolac epoxy resin, bisphenol A novolac epoxy resin, bisphenol F novolac epoxy resin, o-cresol novolac epoxy resin, trifunctional epoxy resin, tetrafunctional epoxy resin, multifunctional epoxy resin, dicyclopentadiene (DCPD) epoxy resin, phosphorus-containing epoxy resin, DOPO epoxy resin, DOPO-HQ epoxy resin, p-xylene epoxy resin, naphthalene epoxy resin, benzopyran epoxy resin, biphenyl novolac epoxy resin, isocyanate modified epoxy resin, phenol benzaldehyde epoxy resin, and phenol aralkyl novolac epoxy resin. DOPO epoxy resin includes DOPO-PN epoxy resin, DOPO-CNE epoxy resin, and DOPO-BPN epoxy resin. DOPO-HQ epoxy resin includes DOPO-HQ-PN epoxy resin, DOPO-HQ-CNE epoxy resin, and DOPO-HQ-BPN epoxy resin.

As regards the halogen-free resin composition of the present invention, the ingredient (B) benzoxazine resin is one, or a combination, of: bisphenol A benzoxazine resin, bisphenol F benzoxazine resin, and phenolphthalein benzoxazine resin. Specifically speaking, preferably, the ingredient (B) benzoxazine resin has at least one of the formulas (1) through (3) as follows:

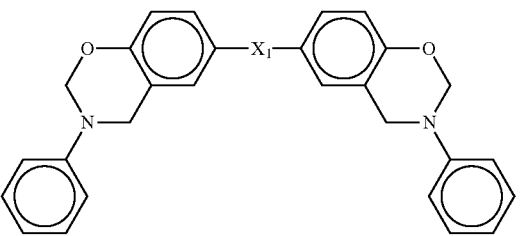

(1)

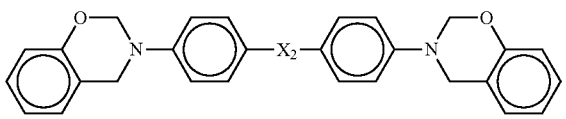

(2)

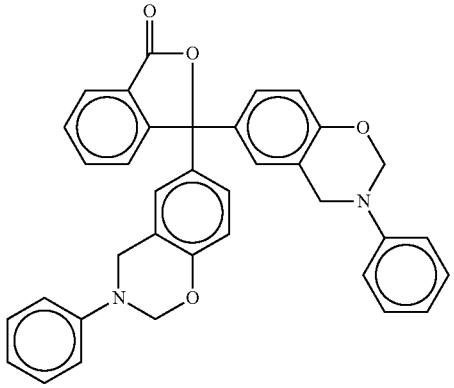

(3)

where $X_1$ denotes R, Ar, or —$SO_2$—, and $X_2$ denotes R, Ar, or —$SO_2$—. R is one of —$C(CH_3)_2$—, —$CH(CH_3)$—, —$CH_2$—, and substituted or unsubstituted dicyclopentadiene (DCPD). Ar is one of substituted or unsubstituted benzene, biphenyl, naphthalene, phenol novolac, bisphenol A, bisphenol A novolac, bisphenol F, and bisphenol F novolac functional group. For example, the brand names of the aforesaid benzoxazine resin include LZ-8270, LZ-8280 and LZ-8290 which are marketed by Huntsman.

As regards the halogen-free resin composition of the present invention, given 100 parts by weight of epoxy resin, 10 to 100 parts by weight of benzoxazine resin is added thereto, wherein the content of the benzoxazine resin thus added allows the halogen-free resin composition to achieve a low dielectric dissipation factor (Df) as expected. If less than 10 parts by weight of benzoxazine resin is added, the expected low dielectric dissipation factor will not be achieved. If more than 100 parts by weight of benzoxazine resin is added, the heat resistance of the copper-clad substrate produced from the resin composition deteriorates. Specifically speaking, preferably, 20 to 80 parts by weight of benzoxazine resin is added in order to prepare the aforesaid halogen-free resin composition of the present invention.

As regards the halogen-free resin composition of the present invention, the ingredient (C) diallylbisphenol A resin is 2,2'-diallylbisphenol A resin, ortho-diallylbisphenol A resin, or para-diallylbisphenol A resin.

As regards the halogen-free resin composition of the present invention, given 100 parts by weight of epoxy resin, 5 to 50 parts by weight of diallylbisphenol A resin is added thereto, such that the resultant halogen-free resin composition features excellent cross-linking, a high glass transition temperature (Tg), and an enhanced bonding force between the resin and the copper foil. In case of less than 5 parts by weight of diallylbisphenol A resin, the resultant halogen-free resin composition will not manifest the anticipated levels of cross-linking and enhancement of glass transition temperature (Tg) and the bonding force with the copper foil. In case of more than 50 parts by weight of diallylbisphenol A resin, the copper-clad substrate produced from the resin composition is characterized by decreased heat resistance, increased hygroscopicity, and deterioration of copper-clad substrate physical properties. Specifically speaking, as regards the halogen-free resin composition of the present invention, preferably, 10 to 25 parts by weight of diallylbisphenol A resin is added.

As regards the halogen-free resin composition of the present invention, the ingredient (D) amine curing agent is an amino compound, or preferably a diamino compound. Specifically speaking, the amine curing agent is one of diamino diphenyl sulfone (DDS), diamino diphenyl methane (DDM), diamino diphenyl ether, diamino diphenyl sulfide, dicyandiamide (DICY), or a combination thereof. The amine curing agent is preferably, one of 4,4'-diamino diphenyl sulfone (DDS), 4,4'-diamino diphenyl methane (DDM), 4,4'-diamino diphenyl ether, 4,4'-diamino diphenyl sulfide, dicyandiamide (DICY), or a combination thereof.

As regards the halogen-free resin composition of the present invention, given 100 parts by weight of epoxy resin, 0.05 to 20 parts by weight of the amine curing agent is added thereto, such that the halogen-free resin composition manifests enhanced bonding force with the copper foil. If less than 0.05 parts by weight of the amine curing agent is added, the expected enhancement of bonding force will not be achieved. If more than 20 parts by weight of the amine curing agent is added, the copper-clad substrate manufactured from the resin composition will manifest reduced heat resistance and increased hygroscopicity, thereby deteriorating the physical properties of the copper-clad substrate. Specifically speaking, as regards the halogen-free resin composition of the present invention, preferably, 1 to 15 parts by weight of the amine curing agent is added.

The halogen-free resin composition of the present invention further comprises a phenolic resin. A compound selectively added to the phenolic resin includes, but is not limited to, at least one of phenolic novolac resin, o-cresol novolac resin, phenol benzaldehyde phenolic resin, and dicyclopentadiene phenolic resin.

The halogen-free resin composition of the present invention further comprises a halogen-free flame retardant. The halogen-free flame retardant is a nitrogen-containing flame retardant or a phosphorus-containing flame retardant. A compound added to the halogen-free flame retardant includes, but is not limited to, at least one of the following: bisphenol diphenyl phosphate, ammonium poly phosphate, hydroquinone bis-(diphenyl phosphate), bisphenol A bis-(diphenylphosphate), tri(2-carboxyethyl)phosphine (TCEP), tri(2-chloroisopropyl)phosphate, trimethyl phosphate (TMP), dimethyl methyl phosphonate (DMMP), resorcinol dixylenylphosphate (RDXP, such as PX-200), phosphazene such as SPB-100, m-phenylene methylphosphonate (PMP), melamine polyphosphate, melamine cyanurate, and tri-hydroxy ethyl isocyanurate. Furthermore, the halogen-free flame retardant can also be 9,10-dihydro-9-oxa-10-phosphaphenanthrene-10-oxide (DOPO), DOPO-containing phenolic resin (such as DOPO-HQ, DOPO-PN, or DOPO-BPN), DOPO-containing epoxy resin, and/or DOPO-HQ-containing epoxy resin, wherein DOPO-BPN is a bisphenol novolac compound, such as DOPO-BPAN, DOPO-BPFN, or DOPO-BPSN.

As regards the halogen-free resin composition of the present invention, given 100 parts by weight of epoxy resin, 10 to 100 parts by weight of a halogen-free flame retardant is added thereto, wherein the content of the halogen-free flame retardant thus added allows the halogen-free resin composition to effectuate flame retardation. If less than 10 parts by weight of halogen-free flame retardant is added, flame retardation will not be achieved. If more than 100 parts by weight of halogen-free flame retardant is added, the copper-clad substrate will demonstrate enhanced hygroscopicity but deteriorated heat resistance.

The halogen-free resin composition of the present invention further comprises one of an inorganic filler, a curing accelerator, a silane coupling agent, a toughening agent, a solvent, or a combination thereof.

As regards the halogen-free resin composition of the present invention, an inorganic filler thus added thereto increases the thermal conductivity of the resin composition and ameliorates its thermal expansion and mechanical strength. Preferably, the inorganic filler is uniformly distributed in the resin composition. The inorganic filler comprises silicon dioxide (existing in a molten state or a non-molten state, or featuring a porous structure or a hollow-core structure), aluminum oxide, aluminum hydroxide, magnesium oxide, magnesium hydroxide, calcium carbonate, aluminum nitride, boron nitride, aluminum silicon carbide, silicon carbide, titanium dioxide, zinc oxide, zirconium oxide, mica, boehmite (AlOOH), calcined talcum, talcum, silicon nitride, and/or calcined kaolin clay. The inorganic filler comes in the form of a spherical shape, a fiber-like shape, board-like shape, particulate shape, strip-like shape, or needle-like shape, and is selectively pre-treated with a silane coupling agent.

The inorganic filler can be in the form of particulate powder of a diameter of less than 100 μm, or preferably a diameter of 1 nm to 20 μm, or most preferably a diameter of less than 1 μm, i.e., nanoscale particulate powder. The needle-shaped inorganic filler consists of particles each having a diameter of less than 50 μm and a length of 1 to 200 μm.

As regards the halogen-free resin composition of the present invention, given 100 parts by weight of epoxy resin, 10 to 1000 parts by weight of an inorganic filler is added thereto. If less than 10 parts by weight of the inorganic filler is added, the halogen-free resin composition will not manifest significant capability of heat conduction, reduced thermal expansion, or enhanced mechanical strength. If more than 1000 parts by weight of the inorganic filler is added, the halogen-free resin composition will manifest deteriorated pore-filling mobility and deteriorated adhesion of copper foil. Specifically speaking, preferably, 100 to 700 parts by weight of an inorganic filler is added to the halogen-free resin composition of the present invention.

The curing accelerator of the present invention comprise a catalysts, such as a Lewis base or a Lewis acid. The Lewis base includes one or more of imidazole, boron trifluoride amine complex, ethyltriphenyl phosphonium chloride, 2-methylimidazole (2M1), 2-phenyl-1H-imidazole (2PZ), 2-ethyl-4-methylimidazole (2E4M1), triphenylphosphine (TPP), and/or 4-dimethylaminopyridine (DMAP). The Lewis acid comprises a metal salt compound, such as a manganese, iron, cobalt, nickel, copper, or zinc metal salt compound, for example, a metal catalyst, such as zinc octoate, or cobalt octoate.

The silane coupling agent of the present invention comprises silane and siloxane, and, when categorized according to a functional group, includes amino silane (AS), amino siloxane, epoxy silane, and epoxy siloxane.

The toughening agent of the present invention comprises an additive selected from the group consisting of rubber resin, carboxyl-terminated butadiene acrylonitrile (CTBN) rubber, and core-shell rubber.

The solvent of the present invention comprises one selected from the group consisting of methanol, ethanol, ethylene glycol monomethyl ether, acetone, methyl ethyl ketone (MEK), methyl isobutyl ketone (MIBK), cyclohexanone, toluene, xylene, methoxyethyl acetate, ethoxyethyl acetate, propoxyethyl acetate, ethyl acetate, dimethylformamide, propylene glycol methyl ether, and a mixture thereof.

The halogen-free resin composition of the present invention further comprises one of polyphenylene ether resin, cyanate ester resin, isocyanate ester resin, maleimide, polyester resin, styrene resin, butadiene resin, phenoxy resin, polyamide resin, and polyimide resin, or a combination thereof.

Yet another objective of the present invention is to provide a prepreg. The prepreg has a low dielectric constant (Dk), a low dielectric dissipation factor, high heat resistance, high flame retardation, low hygroscopicity, and halogen-free characteristics. Accordingly, the prepreg of the present invention comprises a reinforcement material and the aforesaid halogen-free resin composition, wherein the halogen-free resin composition is attached to the reinforcement material by means of impregnation, and heated up at a high temperature to be semi-cured. The reinforcement material, which is a fibrous material, a woven fabric, or a non-woven fabric, such as a glass fabric, enhances the mechanical strength of the prepreg. Furthermore, the reinforcement material is selectively treated with a silane coupling agent or a siloxane coupling agent in order to undergo pretreatment. For example, the reinforcement material is a glass fabric pretreated with a silane coupling agent.

The aforesaid prepreg is heated up at a high temperature or heated at a high temperature and a high pressure to be cured and become a prepreg or a solid-state insulating layer. If the halogen-free resin composition comprises a solvent, the solvent vaporizes during a high-temperature heating process and vanishes.

A further objective of the present invention is to provide a copper clad laminate. The copper clad laminate has a low dielectric characteristic, high heat resistance, high flame retardation, low hygroscopicity, and halogen-free characteristics, and is especially applicable to a circuit board for use in high-speed and high-frequency signal transmission. Accordingly, the present invention provides a copper clad laminate that comprises two or more copper foils and at least an insulating layer. The copper foils are made of at least a metal alloy that contains copper, aluminum, nickel, platinum, silver, and/or gold. The insulating layer is formed by curing the aforesaid prepreg at a high temperature and a high pressure. For example, the aforesaid prepreg is sandwiched between the two copper foils, and then the two copper foils and the prepreg therebetween are laminated together at a high temperature and a high pressure.

The copper clad laminate of the present invention has at least one of the following advantages: a low dielectric constant (Dk) and a low dielectric dissipation factor; excellent heat resistance and flame retardation; low hygroscopicity; high thermal conductivity; and being environmentally friendly by being halogen-free. The copper clad laminate is further processed by circuit-making process to become a circuit board. After electronic components have been mounted on the circuit board, the circuit board and the electronic components thereon can operate well in an adverse environment, such as a high temperature and a high humidity, without having their performance compromised.

A further objective of the present invention is to provide a printed circuit board. The printed circuit board has a low dielectric characteristic, high heat resistance, and high flame retardation, low hygroscopicity, and halogen-free characteristics, and is applicable to high-speed and high-frequency signal transmission. The circuit board comprises at least one aforesaid copper clad laminate and is manufactured by a conventional process.

To further disclose the present invention and enable persons skilled in the art to implement the present invention accordingly. The present invention is disclosed below by several preferred embodiments. However, persons skilled in the art should understand that the preferred embodiments are illustrative of the present invention only, but should not be interpreted as restrictive of the scope of the present invention. Hence, all equivalent modifications and changes made to the aforesaid embodiments without departing from the spirit of the present invention should fall within the scope of the present invention.

BRIEF DESCRIPTION OF THE DRAWINGS

None.

DETAILED DESCRIPTION OF THE PREFERRED EMBODIMENTS

Objectives, features, and advantages of the present invention are hereunder illustrated with specific embodiments.

The resin compositions in embodiments 1 through 6 are enumerated in Table 1. The resin compositions in comparisons 1 through 6 are enumerated in Table 3.

Embodiment 1 (E1)

A resin composition, comprising ingredients as follows:
(A) 100 parts by weight of biphenyl epoxy resin (NC-3000);
(B) 70 parts by weight of benzoxazine resin (LZ 8280);
(C) 10 parts by weight of diallylbisphenol A resin (DABPA);
(D) 1 part by weight of diamino diphenyl methane (DDM);
(E) 40 parts by weight of phosphazene compound (SPB-100);
(F) 80 parts by weight of molten silicon dioxide;
(G) 0.4 parts by weight of amino silane (AS);
(H) 0.1 part by weight of 2-phenylimidazole (2PZ);
(I) 30 parts by weight of methyl ethyl ketone (MEK); and
(J) 20 parts by weight of dimethylformamide (DMF).

Embodiment 2 (E2)

A resin composition, comprising ingredients as follows:
(A) 50 parts by weight of dicyclopentadiene (DCPD) epoxy resin (HP-7200H);

(B) 50 parts by weight of biphenyl epoxy resin (NC-3000);
(C) 20 parts by weight of benzoxazine resin (LZ 8280);
(D) 5 parts by weight of diallylbisphenol A resin (DABPA);
(E) 15 parts by weight of diamino diphenyl sulfone (DDS);
(F) 40 parts by weight of phosphazene compound (SPB-100);
(G) 80 parts by weight of molten silicon dioxide;
(H) 0.4 parts by weight of amino silane (AS);
(I) 0.15 parts by weight of 2-phenylimidazole (2PZ);
(J) 20 parts by weight of dimethylformamide (DMF); and
(K) 25 parts by weight of methyl ethyl ketone (MEK).

Embodiment 3 (E3)

A resin composition, comprising ingredients as follows:
(A) 60 parts by weight of isocyanate ester modified epoxy resin (SEC-365);
(B) 40 parts by weight of biphenyl epoxy resin (NC-3000);
(C) 30 parts by weight of benzoxazine resin (LZ 8280);
(D) 15 parts by weight of diallylbisphenol A resin (DABPA);
(E) 1.5 parts by weight of dicyandiamide (DICY);
(F) 35 parts by weight of phosphazene compound (SPB-100);
(G) 0.15 parts by weight of 2-phenylimidazole (2PZ);
(H) 80 parts by weight of molten silicon dioxide;
(I) 0.4 parts by weight of amino silane (AS);
(J) 20 parts by weight of dimethylformamide (DMF); and
(K) 25 parts by weight of methyl ethyl ketone (MEK).

Embodiment 4 (E4)

A resin composition, comprising ingredients as follows:
(A) 40 parts by weight of dicyclopentadiene (DCPD) epoxy resin (HP-7200H);
(B) 60 parts by weight of biphenyl epoxy resin (NC-3000);
(C) 50 parts by weight of benzoxazine resin (LZ 8280);
(D) 10 parts by weight of diallylbisphenol A resin (DABPA);
(E) 1 part by weight of dicyandiamide (DICY);
(F) 20 parts by weight of dicyclopentadiene phenolic resin (PD-9110);
(G) 40 parts by weight of phosphazene compound (SPB-100);
(H) 0.15 parts by weight of 2-phenylimidazole (2PZ);
(I) 80 parts by weight of molten silicon dioxide;
(J) 0.4 parts by weight of amino silane (AS);
(K) 30 parts by weight of cyclohexanone (CYC); and
(L) 40 parts by weight of methyl ethyl ketone (MEK).

Embodiment 5 (E5)

A resin composition, comprising ingredients as follows:
(A) 30 parts by weight of isocyanate ester modified epoxy resin (SEC-365);
(B) 50 parts by weight of dicyclopentadiene (DCPD) epoxy resin (HP-7200H);
(C) 20 parts by weight of biphenyl epoxy resin (NC-3000);
(D) 40 parts by weight of benzoxazine resin (LZ 8280);
(E) 10 parts by weight of diallylbisphenol A resin (DABPA);
(F) 1 part by weight of diamino diphenyl methane (DDM);
(G) 10 parts by weight of phenolic novolac (PN) resin;
(H) 40 parts by weight of phosphazene compound (SPB-100);
(I) 0.15 parts by weight of 2-phenylimidazole (2PZ);
(J) 80 parts by weight of molten silicon dioxide;
(K) 0.4 parts by weight of amino silane (AS);
(L) 20 parts by weight of cyclohexanone (CYC); and
(M) 35 parts by weight of methyl ethyl ketone (MEK).

Comparison 1 (C1)

A resin composition, comprising ingredients as follows:
(A) 50 parts by weight of isocyanate ester modified epoxy resin (SEC-365);
(B) 50 parts by weight of bisphenol A novolac epoxy resin (BE188);
(C) 5.5 parts by weight of dicyandiamide (DICY);
(D) 30 parts by weight of phosphazene compound (SPB-100);
(E) 0.1 part by weight of 2-phenylimidazole (2PZ);
(F) 0.25 parts by weight of amino silane (AS); and
(G) 30 parts by weight of dimethylformamide (DMF).

Comparison 2 (C2)

A resin composition, comprising ingredients as follows:
(A) 70 parts by weight of isocyanate ester modified epoxy resin (SEC-365);
(B) 30 parts by weight of bisphenol A novolac epoxy resin (BE188);
(C) 45 parts by weight of diallylbisphenol A resin (DABPA);
(D) 1 part by weight of diamino diphenyl sulfone (DDS);
(E) 40 parts by weight of phosphazene compound (SPB-100);
(F) 0.25 parts by weight of 2-phenylimidazole (2PZ);
(G) 80 parts by weight of molten silicon dioxide;
(H) 0.4 parts by weight of amino silane (AS);
(I) 33 parts by weight of cyclohexanone (CYC); and
(J) 40 parts by weight of methyl ethyl ketone (MEK).

Comparison 3 (C3)

A resin composition, comprising ingredients as follows:
(A) 15 parts by weight of bisphenol A novolac epoxy resin (BE188);
(B) 40 parts by weight of dicyclopentadiene (DCPD) epoxy resin (HP-7200H);
(C) 45 parts by weight of DOPO-HQ-containing epoxy resin (PE-122);
(D) 70 parts by weight of benzoxazine resin (LZ 8280);
(E) 8.5 parts by weight of diamino diphenyl sulfone (DDS);
(F) 30 parts by weight of phosphazene compound (SPB-100);
(G) 0.4 parts by weight of 2-phenylimidazole (2PZ);
(H) 0.27 parts by weight of amino silane (AS);
(I) 22 parts by weight of cyclohexanone (CYC); and
(J) 12 parts by weight of methyl ethyl ketone (MEK).

Comparison 4 (C4)

A resin composition, comprising ingredients as follows:
(A) 100 parts by weight of DOPO-HQ-containing epoxy resin (PE-122);
(B) 35 parts by weight of diallylbisphenol A resin (DABPA);
(C) 2.5 parts by weight of dicyandiamide (DICY);
(D) 20 parts by weight of phosphazene compound (SPB-100);
(E) 0.3 parts by weight of 2-phenylimidazole (2PZ);
(F) 0.25 parts by weight of amino silane (AS);
(G) 43 parts by weight of calcined kaolin clay; and
(H) 30 parts by weight of dimethylformamide (DMF).

Comparison 5 (C5)

A resin composition, comprising ingredients as follows:
(A) 60 parts by weight of isocyanate ester modified epoxy resin (SEC-365);
(B) 40 parts by weight of dicyclopentadiene (DCPD) epoxy resin (HP-7200H);
(C) 70 parts by weight of benzoxazine resin (LZ 8280);
(D) 20 parts by weight of diallylbisphenol A resin (DABPA);
(E) 40 parts by weight of phosphazene compound (SPB-100);
(F) 0.25 parts by weight of 2-phenylimidazole (2PZ);
(G) 0.4 parts by weight of amino silane (AS);
(H) 80 parts by weight of molten silicon dioxide;
(I) 33 parts by weight of cyclohexanone (CYC); and
(J) 40 parts by weight of methyl ethyl ketone (MEK).

Comparison 6 (C6)

A resin composition, comprising ingredients as follows:
(A) 20 parts by weight of isocyanate ester modified epoxy resin (SEC-365);
(B) 20 parts by weight of bisphenol A novolac epoxy resin (BE188);
(C) 40 parts by weight of dicyclopentadiene (DCPD) epoxy resin (HP-7200H);
(D) 20 parts by weight of DOPO-HQ-containing epoxy resin (PE-122);
(E) 85 parts by weight of benzoxazine resin (LZ 8280);
(F) 40 parts by weight of phosphazene compound (SPB-100);
(G) 0.3 parts by weight of 2-phenylimidazole (2PZ);
(H) 54 parts by weight of calcined kaolin clay;
(I) 0.27 parts by weight of amino silane (AS);
(J) 22 parts by weight of cyclohexanone (CYC); and
(K) 12 parts by weight of methyl ethyl ketone (MEK).

The resin compositions of the embodiments 1 through 5 and comparisons 1 through 6 were evenly mixed in a mixing tank by batch and transferred to an impregnation tank. Then, a glass fabric was passed through the impregnation tank to allow the resin composition to be attached to the glass fabric and then undergoing a heating and baking process to become semi-cured, thereby forming a prepreg.

Take four pieces of prepreg mentioned above prepared by the same batch and two pieces of 18-μm copper foils, and stack them in the order of a copper foil, four pieces of prepreg, and a copper foil. Then, the two copper foils and the four pieces of prepreg therebetween were laminated against each other in a vacuum condition and at 220° C. for two hours to form a copper clad laminate, wherein the four pieces of prepreg were cured to form an insulating layer between the two copper foils.

A physical properties measurement process was performed on the copper-clad substrate, and a non-copper-containing substrate resulting from a copper foil etching process. The physical properties measurement process measures: glass transition temperature (Tg), heat resistance T-288 (including clad and unclad measurement results, wherein time-related data of the copper-clad substrate and the non-copper-containing substrate subjected to immersion tin at 288° C. were measured, respectively, with thermomechanical analysis (TMA). A person skilled in this art can derives that the heat resistance of the substrates depends on the time-related data, wherein the time-related result is the larger the better), thermal cracking temperature (Td, measured by TGA, the temperature (° C.) is the higher the better), hygroscopicity (%)/PCT (2 atm/1 hr) (hygroscopicity of a specimen was measured at high temperature and high humidity, and hygroscopicity is the lower the better), PCT (2 atm/3 hours) (heat resistance of a specimen was tested at high temperature and high humidity), dielectric constant (Dk) (wherein Dk is the lower the better), dissipation factor (Df) (wherein Df is the lower the better), and flame retardation (flaming test, UL94, wherein the rank of levels of flame retardation is: V-0>V-1>V-2). The results of measurement of the resin compositions of embodiments 1 through 5 are shown in Table 2. The results of measurement of the resin compositions of comparisons 1 through 6 are shown in Table 4.

TABLE 1

| ingredient | | E1 | E2 | E3 | E4 | E5 |
|---|---|---|---|---|---|---|
| epoxy resin | SEC-365 | — | — | 60 | — | 30 |
| | HP-7200H | — | 50 | — | 40 | 50 |
| | NC-3000 | 100 | 50 | 40 | 60 | 20 |
| benzoxazine resin | LZ 8280 | 70 | 20 | 30 | 50 | 40 |
| diallylbisphenol A resin | DABPA | 10 | 5 | 15 | 10 | 10 |
| amine curing agent | DICY | — | — | 1.5 | 1 | — |
| | DDM | 1 | — | — | — | 1 |
| | DDS | — | 15 | — | — | — |
| phenolic novolac resin | PN | — | — | — | — | 10 |
| dicyclopentadiene phenolic resin | PD-9110 | — | — | — | 20 | — |
| halogen-free flame retardant | SPB-100 | 40 | 40 | 35 | 40 | 40 |
| catalyst | 2PZ | 0.1 | 0.15 | 0.15 | 0.15 | 0.15 |
| amino silane (AS) | AS | 0.4 | 0.4 | 0.4 | 0.4 | 0.4 |
| solvent | MEK | 30 | 25 | 25 | 40 | 35 |
| | CYC | — | — | — | 30 | 20 |
| | DMF | 20 | 20 | 20 | — | — |
| inorganic filler | molten silicon dioxide | 80 | 80 | 80 | 80 | 80 |

TABLE 2

| property test | E1 | E2 | E3 | E4 | E5 |
|---|---|---|---|---|---|
| glass transition temperature (Tg) ° C. | 160/169 | 168/175 | 157/164 | 155/165 | 157/163 |
| peel strength (N/mm) (Hoz) | 0.95 | 1.12 | 1.25 | 1.30 | 1.20 |
| flame retardation test (UL-94) | V-0 | V-0 | V-0 | V-0 | V-0 |
| heat resistance T-288 (unclad) | >70 | >70 | >70 | >70 | >70 |
| heat resistance T-288 (clad) | 23 | 20 | 20 | 25 | 25 |
| thermal cracking temperature (Td) ° C. | 360 | 365 | 365 | 365 | 365 |
| hygroscopicity (%)/PCT (2 atm/1 hr) | 0.16 | 0.15 | 0.16 | 0.16 | 0.15 |
| dielectric constant Dk (1 GHz) | 4.25 | 4.35 | 4.10 | 4.15 | 4.25 |
| dielectric dissipation factor Df (1 GHz) | 0.013 | 0.010 | 0.011 | 0.009 | 0.008 |
| PCT (2 atm/3 hours) | Pass | Pass | Pass | Pass | Pass |

TABLE 3

| ingredient | | C1 | C2 | C3 | C4 | C5 | C6 |
|---|---|---|---|---|---|---|---|
| epoxy resin | SEC-365 | 50 | 70 | — | — | 60 | 20 |
| | BE188 | 50 | 30 | 15 | — | — | 20 |
| | HP-7200H | — | — | 40 | — | 40 | 40 |
| | PE-122 | — | — | 45 | 100 | — | 20 |
| benzoxazine resin | LZ 8280 | — | — | 70 | — | 70 | 85 |
| diallylbisphenol A resin | DABPA | — | 45 | — | 35 | 20 | — |
| amine curing agent | DICY | 5.5 | — | — | 2.5 | — | — |
| | DDM | — | — | — | — | — | — |
| | DDS | — | 1 | 8.5 | — | — | — |
| halogen-free flame retardant | SPB-100 | 30 | 40 | 30 | 20 | 40 | 40 |
| catalyst | 2PZ | 0.1 | 0.25 | 0.4 | 0.3 | 0.25 | 0.3 |
| amino silane (AS) | AS | 0.25 | 0.40 | 0.27 | 0.25 | 0.40 | 0.27 |
| solvent | MEK | — | 40 | 12 | — | 40 | 12 |
| | CYC | — | 33 | 22 | — | 33 | 22 |
| | DMF | 30 | — | — | 30 | — | — |
| inorganic filler | molten silicon dioxide | — | 80 | — | — | 80 | — |
| | calcined kaolin clay | — | — | — | 43 | — | 54 |

TABLE 4

| property test | C1 | C2 | C3 | C4 | C5 | C6 |
|---|---|---|---|---|---|---|
| glass transition temperature (Tg) °C. | 156/163 | 141/150 | 150/152 | 139/143 | 155/163 | 140/147 |
| peel strength (N/mm) (Hoz) | 1.20 | 0.85 | 1.12 | 1.05 | 0.93 | 1.10 |
| flame retardation test (UL-94) | V-0 | V-0 | V-0 | V-0 | V-0 | V-0 |
| heat resistance T-288 (unclad) | 12 | >70 | >70 | 42 | >70 | 10 |
| heat resistance T-288 (clad) | 1 | 30 | 30 | 10 | 15 | 5 |
| thermal cracking temperature (Td) °C. | 340 | 365 | 370 | 345 | 365 | 360 |
| hygroscopicity (%)/PCT (2 atm/1 hr) | 0.35 | 0.25 | 0.15 | 0.35 | 0.15 | 0.25 |
| dielectric constant Dk (1 GHz) | 4.10 | 4.25 | 4.45 | 4.35 | 4.45 | 4.35 |
| dielectric dissipation factor Df (1 GHz) | 0.017 | 0.012 | 0.009 | 0.014 | 0.009 | 0.011 |
| PCT (2 atm/3 hours) | Fail | Fail | Pass | Fail | Pass | Fail |

As indicated by the data of embodiments 1 through 5, all the physical properties of the resin composition of the present invention meet the expected specifications and standards. A comparison of embodiments 1 and 2 reveals that embodiment 2 features the use of DDS to increase glass transition temperature (Tg) of the resin composition. A comparison of embodiments 1 and 3 reveals that embodiment 3 features the use of DICY to enhance peel strength and reduce Dk. A comparison of embodiments 3 and 4 reveals that embodiment 4 maintains a low Dk and enhances peel strength by increasing PD-9110. A comparison of embodiments 1 and 5 reveals that embodiment 5 enhances peel strength by increasing PN.

A comparison of the data of the above embodiments and comparisons yields the following findings:

comparison 1 does not involve use of benzoxazine resin and diallylbisphenol A resin, thereby resulting in overly high Df and deterioration of heat resistance of the copper-clad substrate (PCT board rupture, T-288 (unclad) board rupture occurs in just 12 minutes, and T-288 (clad) board rupture occurs in just 1 minute);

comparison 2 does not involve use of benzoxazine resin, thereby causing overly low peel strength and PCT board rupture;

comparison 3 does not involve use of diallylbisphenol A resin, thereby causing overly high Dk;

comparison 4 does not involve use of benzoxazine resin, thereby deteriorating heat resistance (T-288, and PCT board rupture);

comparison 5 does not involve use of any amine curing agent, thereby causing overly high Dk and overly low peel strength; and comparison 6 does not involve use of diallylbisphenol A resin and amine curing agent, thereby deteriorating heat resistance.

As described above, the present invention meets the three requirements of patentability, namely novelty, non-obviousness, and industrial applicability. Regarding novelty, and non-obviousness, the halogen-free resin composition of the present invention features specific ingredients, and proportions thereof to attain low dielectric constant (Dk), low dielectric dissipation factor (Df), high heat resistance, and high flame retardation, and produce a prepreg or a resin film, and is thus applicable to copper clad laminates, and printed circuit boards. Regarding industrial applicability, products derived from the present invention meet market demands fully.

The present invention is disclosed above by preferred embodiments. However, persons skilled in the art should understand that the preferred embodiments are illustrative of the present invention only, but should not be interpreted as restrictive of the scope of the present invention. Hence, all equivalent modifications, and replacements made to the aforesaid embodiments should fall within the scope of the present invention. Accordingly, the legal protection for the present invention should be defined by the appended claims.

What is claimed is:

1. A halogen-free resin composition, comprising:
(A) 100 parts by weight of epoxy resin, wherein the epoxy resin is at least one selected from the group consisting of isocyanate ester modified epoxy resin, dicyclopentadiene epoxy resin, and biphenyl novolac epoxy resin;

(B) 20 to 70 parts by weight of benzoxazine resin, wherein the benzoxazine resin is bisphenol A benzoxazine resin, bisphenol F benzoxazine resin, or their combination;

(C) 10 to 15 parts by weight of diallylbisphenol A resin; and (D) an amine curing agent, wherein the amine curing agent is 1 to 13 parts by weight of one selected from the group consisting of diamino diphenyl sulfone (DDS) and diamino diphenyl methane (DDM), or wherein the amine curing agent is 1 to 1.5 parts by weight of dicyandiamide (DICY).

2. The composition of claim 1, wherein the diallylbisphenol A resin is at least one selected from the group consisting of 2,2'-diallylbisphenol A resin, ortho-diallylbisphenol A resin, and para-diallylbisphenol A resin.

3. The composition of claim 1, further comprising a halogen-free flame retardant being at least one selected from the group consisting of bisphenol diphenyl phosphate, ammonium poly phosphate, hydroquinone bis-(diphenyl phosphate), bisphenol A bis-(diphenylphosphate), tri(2-carboxyethyl)phosphine (TCEP), tri(2-chloroisopropyl)phosphate, trimethyl phosphate (TMP), dimethyl methyl phosphonate (DMMP), resorcinol dixylenylphosphate (RDXP), phosphazene, m-phenylene methylphosphonate (PMP), melamine polyphosphate, melamine cyanurate, and tri-hydroxy ethyl isocyanurate, 9,10-dihydro-9-oxa-10-phosphaphenanthrene-10-oxide (DOPO), DOPO-containing phenolic resin, DOPO-containing epoxy resin, and DOPO-HQ-containing epoxy resin.

4. The composition of claim 1, further comprising at least one selected from the group consisting of an inorganic filler, a curing accelerator, a siloxane coupling agent, a toughening agent, and a solvent.

5. The composition of claim 1, further comprising at least one selected from the group consisting of phenolic novolac resin, o-cresol novolac resin, phenol benzaldehyde novolac resin, dicyclopentadiene phenolic resin, and modified derivatives thereof.

6. The composition of claim 1, further comprising at least one selected from the group consisting of polyphenylene ether resin, cyanate ester resin, isocyanate ester resin, maleimide, polyester resin, styrene resin, butadiene resin, phenoxy resin, polyamide, polyimide, and modified derivatives thereof.

7. A prepreg, comprising the composition of claim 1.

8. A copper clad laminate, comprising the prepreg of claim 7.

9. A printed circuit board, comprising the copper clad laminate of claim 8.

* * * * *